US008029292B2

(12) United States Patent
Jin et al.

(10) Patent No.: US 8,029,292 B2
(45) Date of Patent: Oct. 4, 2011

(54) MULTI-SOCKET GUIDE AND TEST DEVICE COMPRISING THE SAME

(75) Inventors: Hong-jun Jin, Suwon-si (KR); Jong-mi Kim, Yongin-si (KR); Yoon-gyu Song, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/558,036

(22) Filed: Sep. 11, 2009

(65) Prior Publication Data

US 2010/0068914 A1 Mar. 18, 2010

(30) Foreign Application Priority Data

Sep. 17, 2008 (KR) ........................ 10-2008-0091256

(51) Int. Cl.
*H01R 12/00* (2006.01)

(52) U.S. Cl. .......................................... 439/71; 439/268

(58) Field of Classification Search .................... 439/66, 439/70, 71, 268–269; 342/761, 762
See application file for complete search history.

(56) References Cited

U.S. PATENT DOCUMENTS 6,280,219 B1 * 8/2001 Sano et al. .................... 439/268
6,863,541 B2 * 3/2005 Kagami .......................... 439/71
7,173,442 B2 * 2/2007 Treibergs et al. ........ 324/750.25

FOREIGN PATENT DOCUMENTS

JP 2006-138790 6/2006
KR 10-0510501 B1 6/2004
KR 1020080005738 1/2008

* cited by examiner

*Primary Examiner* — Khiem Nguyen
(74) *Attorney, Agent, or Firm* — F. Chau & Associates, LLC

(57) ABSTRACT

A multi-socket guide for guiding a semiconductor package to a semiconductor package testing device includes a housing, a guiding unit disposed in the housing, the guiding unit guiding the housing to the semiconductor package testing device, and a mounting unit disposed in the housing, the mounting unit receiving the semiconductor package, wherein a size of the mounting unit corresponds to a size of a ball area of the semiconductor package.

20 Claims, 6 Drawing Sheets x 4 / x 8 x 16

MULTI-SOCKET GUIDE AND TEST DEVICE COMPRISING THE SAME

CROSS-REFERENCE TO RELATED APPLICATION

This application claims priority to Korean Patent Application No. 10-2008-0091256, filed on Sep. 17, 2008, the disclosure of which is incorporated herein in its entirety by reference.

BACKGROUND OF THE INVENTION

1. Technical Field

The present disclosure relates to a guide guiding a semiconductor package to a test board of a semiconductor package test device, and more particularly, to a multi-socket guide guiding a semiconductor package to a test board of a semiconductor package test device.

2. Discussion of Related Art

A semiconductor package can be tested by a semiconductor package test device including a test board therein. A guide disposed in the test device guides the semiconductor package to be properly located on the test board. However, it is inconvenient when the guide is replaced based on a shape or size of the semiconductor package to be tested.

SUMMARY OF THE INVENTION

Exemplary embodiments of the present invention provide a multi-socket guide disposed in a semiconductor package test device. A groove of the multi-socket guide can have a size corresponding to an arrangement of a plurality of balls disposed on the semiconductor packages to be tested. As such, the multi-socket guide according to exemplary embodiments of the present invention can guide semiconductor packages into the test device irrespective of a size and shape of the semiconductor packages.

According to an exemplary embodiment of the present invention, a multi-socket guide for guiding a semiconductor package to a semiconductor package testing device, the multi-socket guide comprises a housing, a guiding unit disposed in the housing, the guiding unit guiding the housing to the semiconductor package testing device, and a mounting unit disposed in the housing, the mounting unit receiving the semiconductor package, wherein a size of the mounting unit corresponds to a size of a ball area of the semiconductor package.

A plurality of balls can be formed in the ball area.

The size of the ball area can be 8.5 mm in width and 6.9 mm in length.

The size of the ball area can be 11.7 mm in width and 6.9 mm in length.

The housing may comprise a shock absorbing material on a first surface facing the semiconductor package testing device.

The housing can have a substantially rectangular shape, and the guiding unit can be located near four corners of the housing.

One semiconductor package can be mounted in the mounting unit.

A plurality of semiconductor packages can be mounted in the mounting unit.

The mounting unit may comprise at least two mounting grooves respectively having a size of 8.5 mm in width and 6.9 mm in length.

The mounting unit may comprise at least two mounting grooves respectively having a size of 11.7 mm in width and 6.9 mm in length.

The mounting unit may comprise at least two mounting grooves, the first mounting groove having a size of 8.5 mm in width and 6.9 mm in length and the second mounting groove having a size of 11.7 mm in width and 6.9 mm in length.

The housing may comprise flat type first and second surfaces.

According to an exemplary embodiment of the present invention, a semiconductor package test device comprises a multi-socket guide including a housing, a guiding unit disposed in the housing, the guiding unit guiding the housing to the semiconductor package testing device, and a mounting unit disposed in the housing, the mounting unit receiving the semiconductor package, wherein a size of the mounting unit corresponds to a size of a ball area of the semiconductor package, and a test board having a contact unit thereon, the contact unit receiving the multi-socket guide.

The size of the ball area can be 8.5 mm in width and 6.9 mm in length.

The size of the ball area can be 11.7 mm in width and 6.9 mm in length.

The contacting unit may contact a plurality of balls of the semiconductor package.

The contacting unit may comprise rubber.

The semiconductor package test device can be automatic test equipment (ATE).

BRIEF DESCRIPTION OF THE DRAWINGS

Exemplary embodiments of the present invention will be more clearly understood from the following detailed description taken in conjunction with the accompanying drawings in which.

DETAILED DESCRIPTION OF EXEMPLARY EMBODIMENTS

The present invention will now be described more fully with reference to the accompanying drawings in which example embodiments of the invention are shown. This invention may, however, be embodied in many different forms and should not be construed as limited to the exemplary embodiments set forth herein.

Figure 1:
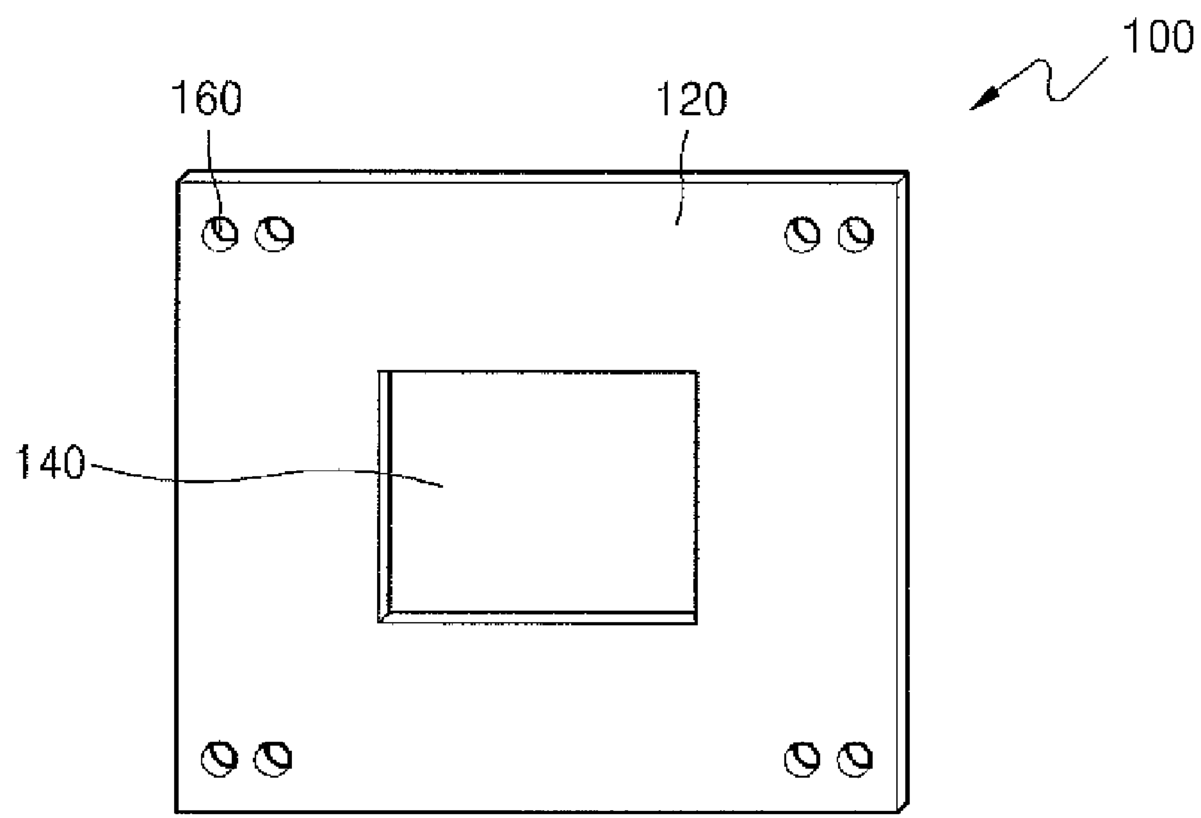
FIG. 1 shows a multi-socket guide according to an exemplary embodiment of the present invention.

FIG. 1 shows a multi-socket guide 100 according to an exemplary embodiment of the present invention.

Referring to FIG. 1, the multi-socket guide 100 guides a semiconductor package to a semiconductor package testing device. The multi-socket guide 100 comprises a housing 120, a mounting unit 140, and a plurality of guiding units 160.

The guiding units 160 guide the multi-socket guide 100 to the semiconductor package testing device. The guiding units 160 may be circular grooves formed near the four corners of the hosing 120 according to an exemplary embodiment of the present invention. The circular grooves may be coupled to circular projections of the semiconductor package testing device.

The semiconductor package is mounted to the mounting unit 140. In an exemplary embodiment, a size and shape of the mounting unit 140 can be substantially similar to a shape and size of a ball area of the semiconductor package. A plurality of balls can be located in the ball area.

Figure 2A:
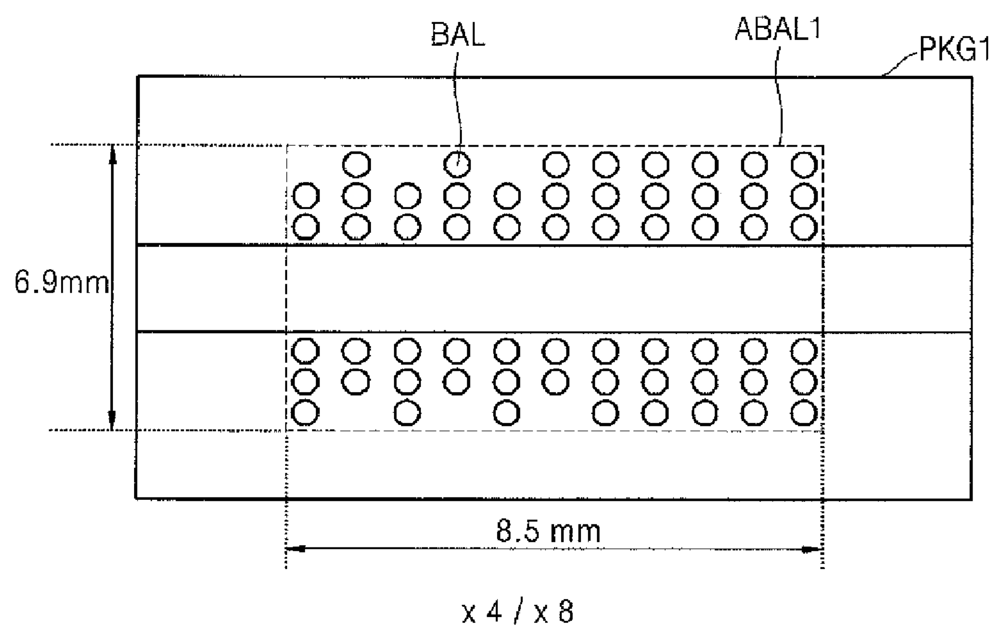
FIGS. 2A and 2B show ball areas disposed on a semiconductor package according to the Joint Electron Device Engineering Council (JEDEC) standard.
Figure 2B:
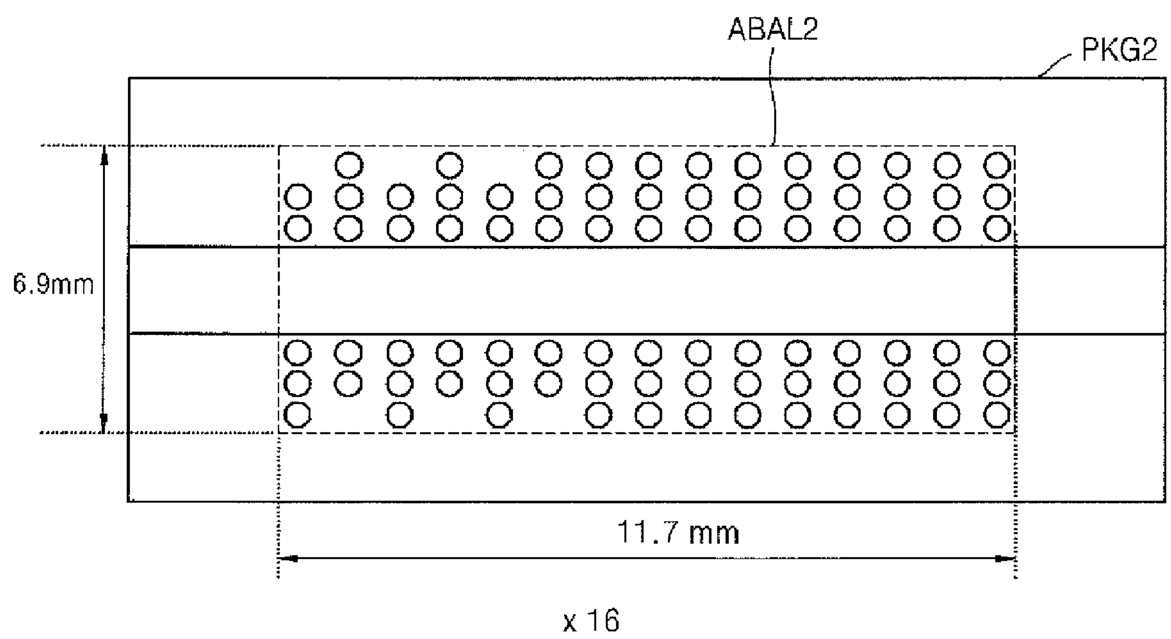

FIGS. 2A and 2B show ball areas ABAL1 and ABAL2 respectively disposed on semiconductor packages PKG1 and PKG2 according to the Joint Electron Device Engineering Council (JEDEC) standard.

Referring to FIGS. 2A and 2B, a plurality of balls BALs are located in the ball areas ABAL1 and ABAL2 of the respective semiconductor packages PKG1 and PKG2. For example, the ball areas ABAL1 and ABAL2 have two sizes corresponding to the number of bits of input and output data.

Referring to FIG. 2A, the semiconductor package PKG1 of x4 and x8 has the ball area ABAL1 of 8.5 mm in width and 6.9 mm in length according to the JEDEC standard. Referring to FIG. 2B, the semiconductor package PKG2 of x16 has the ball area ABAL2 of 11.7 mm in width and 6.9 mm in length according to the JEDEC standard.

Figure 3A:
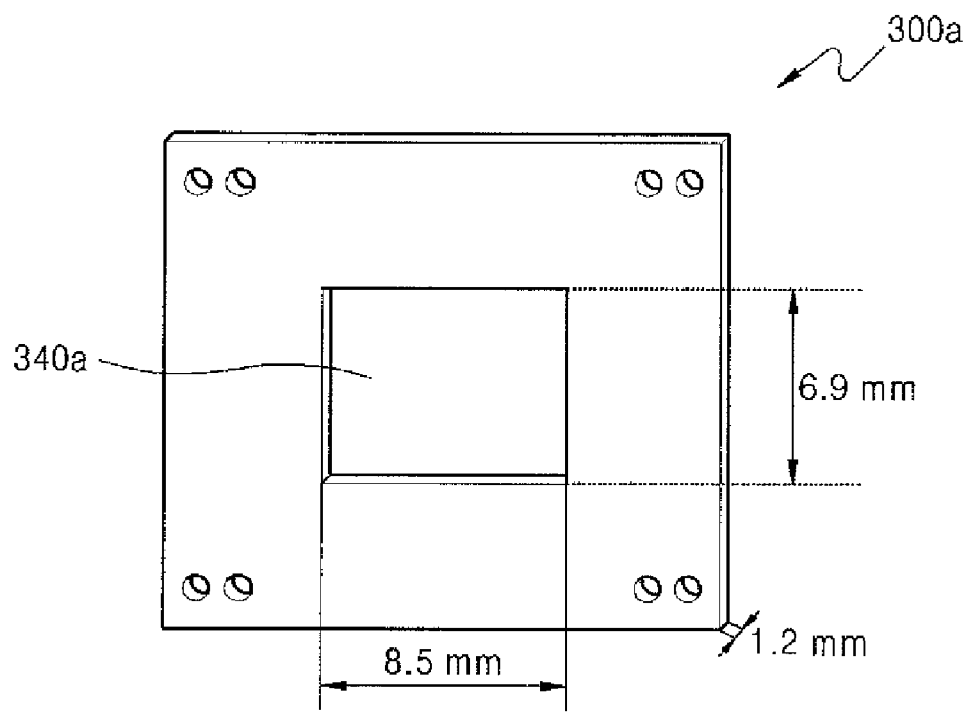
FIGS. 3A and 3B show multi-socket guides according to exemplary embodiments of the present invention.
Figure 3B:
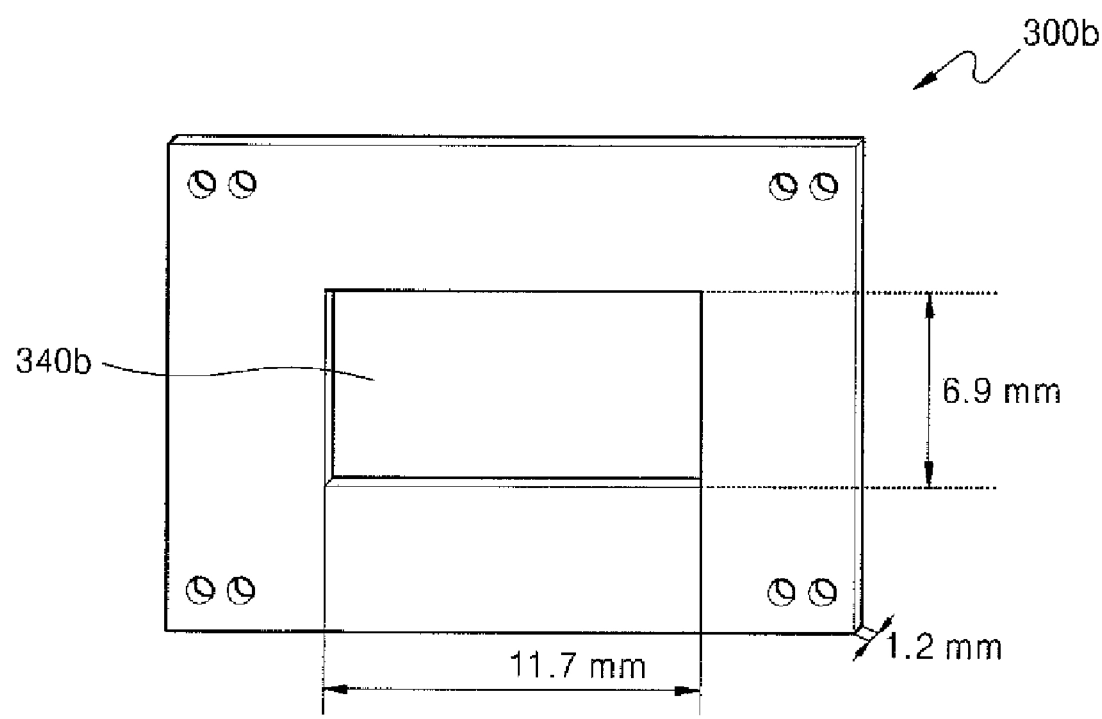

FIGS. 3A and 3B show multi-socket guides 300*a* and 300*b* according to exemplary embodiments of the present invention.

Referring to FIGS. 2A, 2B, 3A and 3B, the multi-socket guides 300*a* and 300*b* comprise mounting units 340*a* and 340*b*, respectively. The mounting units 340*a* and 340*b* respectively have sizes corresponding to the ball areas ABAL1 and ABAL2 of the semiconductor packages PKG1 and PKG2. In an exemplary embodiment, the mounting units 340*a* and 340*b* have the same sizes as the ball areas ABAL1 and ABAL2. In an exemplary embodiment, the mounting units 340*a* and 340*b* may be larger than the ball areas ABAL1 and ABAL2.

The sizes of the multi-socket guides 100, 300*a*, and 300*b* according to exemplary embodiments correspond to an arrangement of balls included in a semiconductor package, so that semiconductor package having various sizes can be mounted in a single guide. Therefore, the single guide can guide a semiconductor package having various sizes to a semiconductor package testing device. As such, according to exemplary embodiments of the present invention, semiconductor packages having various sizes can be tested without replacing the guide.

Referring to FIGS. 1, 3A, and 3B, the housing 120 of the multi-socket guide 100 may have, for example, flat type front and rear surfaces. In an exemplary embodiment, a thickness of the housing 120 may be about 1.2 mm.

Figure 4:
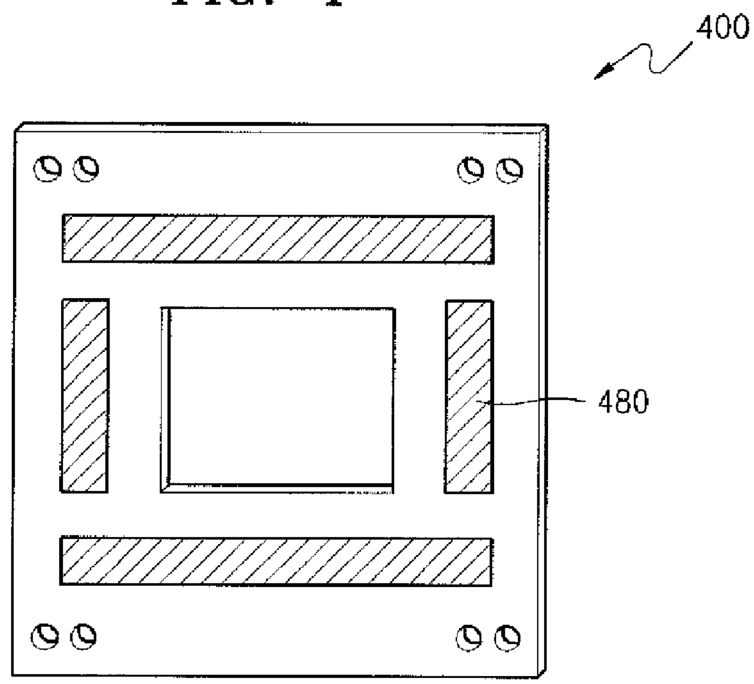
FIG. 4 shows a multi-socket guide according to an exemplary embodiment of the present invention.

FIG. 4 shows a multi-socket guide 400 according to an exemplary embodiment of the present invention.

Figure 5:
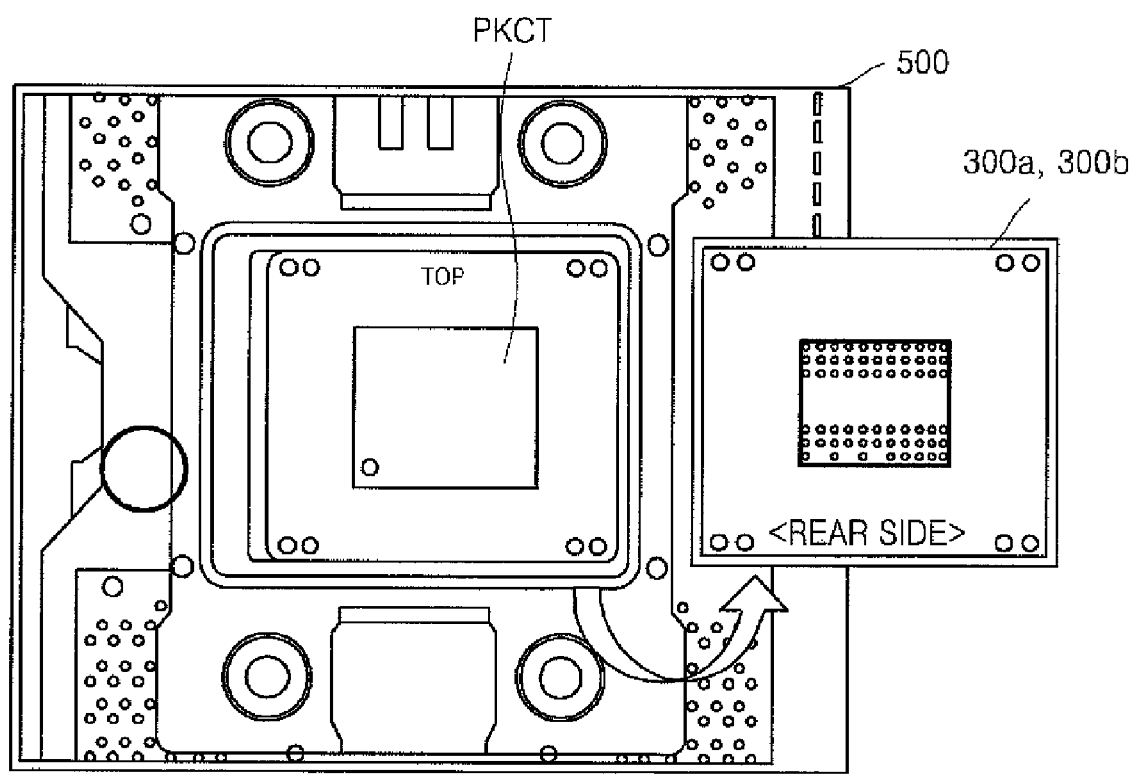
FIG. 5 is a top view of a multi-socket guide mounted on a test board disposed in a test device according to an exemplary embodiment of the present invention.

Referring to FIGS. 4 and 5, a housing of the multi-socket guide 400 may comprise a shock absorbing material 480 for absorbing a physical shock applied to a semiconductor package when the multi-socket guide 400 is mounted on a semiconductor package testing device 500.

Figure 6:
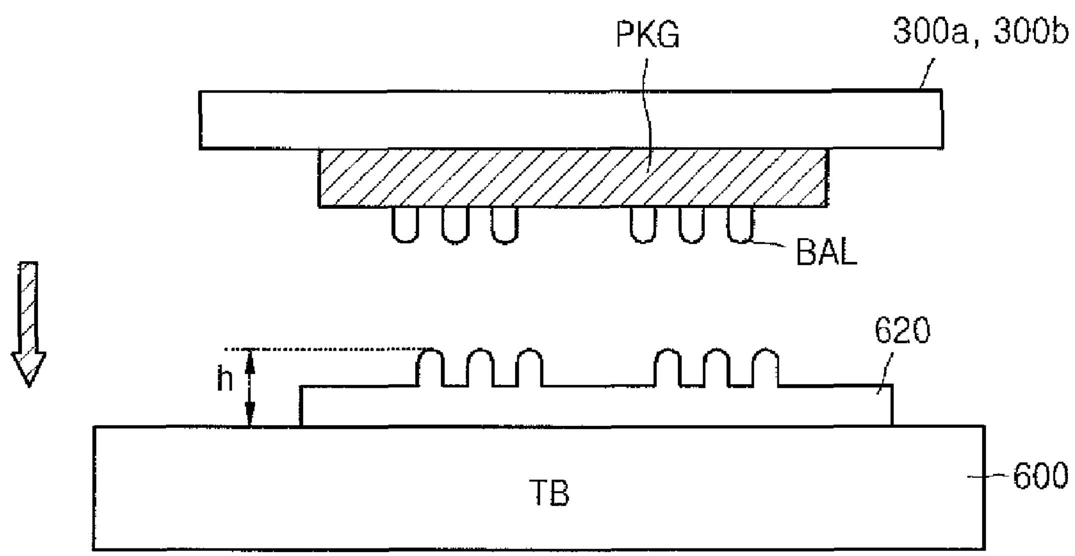
FIG. 6 is a side view of a multi-socket guide mounted on a test board of a semiconductor package test device according to an exemplary embodiment of the present invention.

FIG. 5 is a top view of the multi-socket guides 300*a* and 300*b* mounted on a test board in the semiconductor package testing device 500 according to an exemplary embodiment of the present invention. FIG. 6 is a side view of the multi-socket guides 300*a* and 300*b* moving in the arrow direction toward a test board 600 of the semiconductor package testing device 500.

Referring to FIGS. 5 and 6, the semiconductor package testing device 500 may be automatic test equipment (ATE). The multi-socket guides 300*a* and 300*b* may be received by the semiconductor package testing device 500. In an exemplary embodiment, the test board 600 of the semiconductor package testing device 500 may comprise a contacting unit 620 contacting balls BALs of the semiconductor package PKG. In an exemplary embodiment, the contacting unit 620 may comprise rubber.

Figure 7:
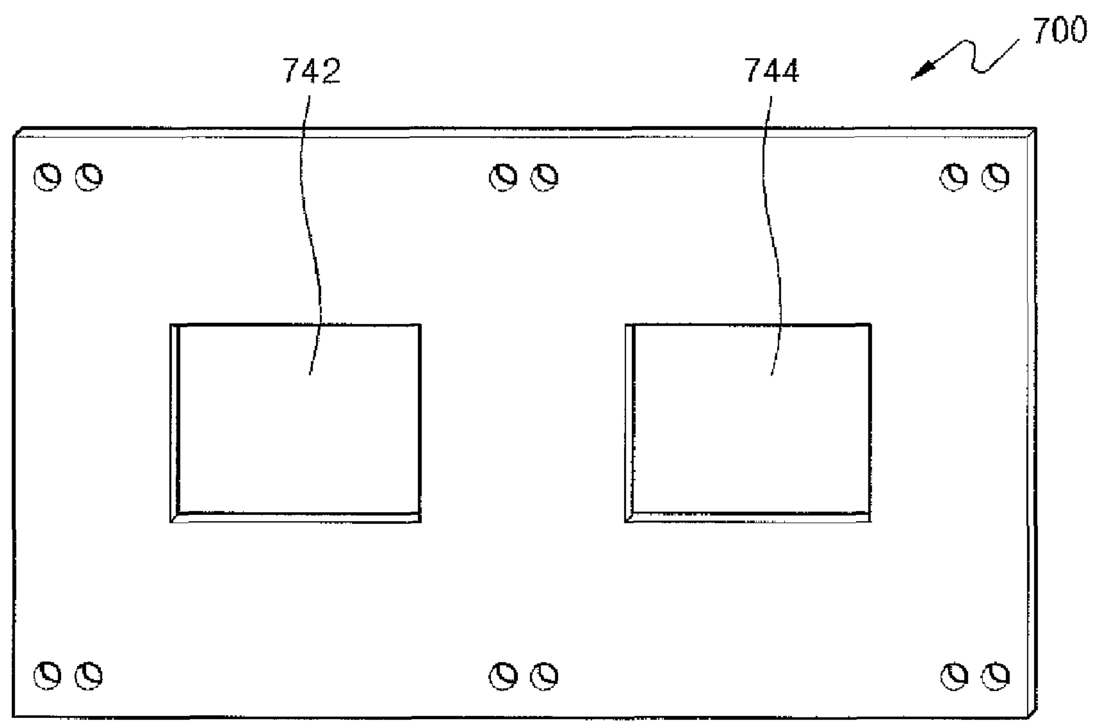
FIG. 7 shows a multi-socket guide according to an exemplary embodiment of the present invention.
Figure 8:
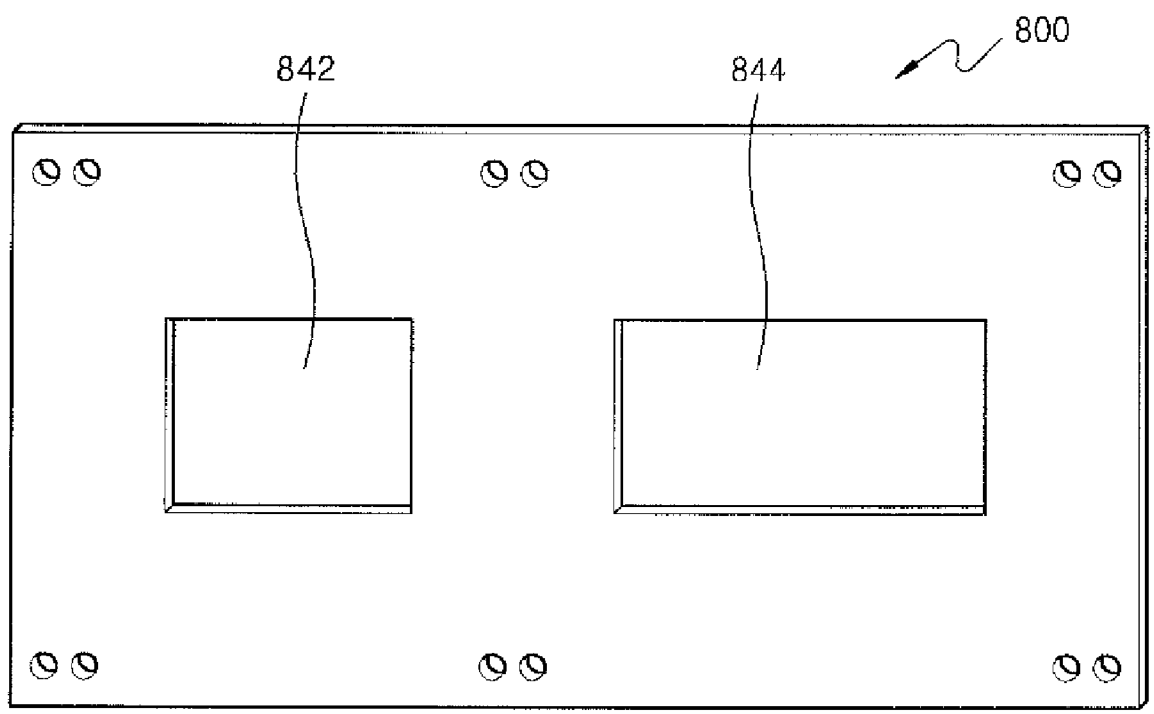
FIG. 8 shows a multi-socket guide according to an exemplary embodiment of the present invention.

FIG. 7 shows a multi-socket guide 700 according to an exemplary embodiment of the present invention. FIG. 8 shows a multi-socket guide 800 according to an exemplary embodiment of the present invention.

Referring to FIGS. 1, 3A and 3B, a single semiconductor package can be mounted on the mounting units 140, 340*a*, and 340*b* of the multi-socket guides 100, 300A, and 300B according to an exemplary embodiment of the present invention. Referring to FIGS. 7 and 8, two semiconductor packages may be mounted on respective mounting units according to an exemplary embodiment of the present invention. The mounting units comprise two mounting grooves 742 and 744, and 842 and 844, respectively.

Referring to FIGS. 2A and 7, the sizes of the two mounting grooves 742 and 744 may substantially be the same as the ball area ABAL1 of the semiconductor package PKG1. Referring to FIGS. 2A, 2B and 8, the sizes of the mounting grooves 842 and 844 may substantially be the same as the ball area ABAL1 of the semiconductor package PKG1 and the ball area ABAL2 of the semiconductor package PKG2, respectively.

According to an exemplary embodiment of the present invention, two semiconductor packages can be mounted, for example, simultaneously, on the multi-socket guides 700 and 800. According to an exemplary embodiment, three or more semiconductor packages may be mounted, for example, simultaneously, on a multi-socket guide. According to an exemplary embodiment, a multi-socket guide may comprise mounting grooves corresponding to ball areas included in the semiconductor package PKG1.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A multi-socket guide for guiding a semiconductor package to a semiconductor package test device, the multi-socket guide comprising:

a housing;

a guiding unit disposed in the housing, the guiding unit guiding the housing to the semiconductor package test device; and a mounting unit disposed in the housing, wherein a size of the mounting unit corresponds to a size of a ball area disposed on a lower surface of the semiconductor package, and the mounting unit comprises a groove configured to receive and cover an entire upper surface of the semiconductor package, wherein the upper and lower surfaces of the semiconductor package oppose each other, wherein the housing comprises a shock absorbing material disposed on a first surface facing the semiconductor package test device.

2. The multi-socket guide of claim 1, wherein a plurality of balls are formed in the ball area, and the size of the ball area is a first size according to the Joint Electron Device Engineering Council (JEDEC) standard.

3. The multi-socket guide of claim 1, wherein a plurality of balls are formed in the ball area, and the size of the ball area is a second size according to the JEDEC standard.

4. A semiconductor package test device, comprising:

a multi-socket guide comprising:

a housing;

a guiding unit disposed in the housing, the guiding unit guiding the housing to the semiconductor package test device; and a mounting unit disposed in the housing, wherein a size of the mounting unit corresponds to a size of a ball area disposed on a lower surface of a semiconductor package, and the mounting unit comprises a groove configured to receive and cover an entire upper surface of the semiconductor package, wherein the upper and lower surfaces of the semiconductor packages oppose each other; and a test board having a contact unit thereon, the contact unit receiving the multi-socket guide, wherein the housing has a substantially rectangular shape, the guiding unit includes circular grooves located near four corners of the housing, and the semiconductor package test device includes circular projections configured to be coupled to the circular grooves.

5. The multi-socket guide of claim 1, wherein one semiconductor package is mounted in the mounting unit.

6. The multi-socket guide of claim 1, wherein a plurality of semiconductor packages are mounted in the mounting unit.

7. The multi-socket guide of claim 6, wherein the mounting unit comprises at least two mounting grooves respectively having a first size according to the JEDEC standard.

8. The multi-socket guide of claim 6, wherein the mounting unit comprises at least two mounting grooves respectively having a second size according to the JEDEC standard.

9. The multi-socket guide of claim 6, wherein the mounting unit comprises at least two mounting grooves, the first mounting groove having a first size according to the JEDEC standard and the second mounting groove having a second size according to the JEDEC standard.

10. The multi-socket guide of claim 1, wherein the housing comprises flat type first and second surfaces.

11. The semiconductor package test device of claim 4, wherein the size of the ball area is a first size according to the JEDEC standard.

12. The semiconductor package test device of claim 4, wherein the size of the ball area is a second size according to the JEDEC standard.

13. The semiconductor package test device of claim 4, wherein the contacting unit contacts a plurality of balls of the semiconductor package.

14. The semiconductor package test device of claim 13, wherein the contacting unit comprises rubber.

15. The semiconductor package test device of claim 4, wherein the semiconductor package test device is automatic test equipment (ATE).

16. The semiconductor package test device of claim 11, wherein the first size according to the JEDEC standard is specified by 8.5 mm in width and 6.9 mm in length.

17. The semiconductor package test device of claim 12, wherein the second size according to the JEDEC standard is specified by 11.7 mm in width and 6.9 mm in length.

18. The semiconductor package test device of claim 4, wherein the housing comprises a shock absorbing material disposed on a first surface facing the semiconductor package test device.

19. The semiconductor package test device of claim 18, wherein the mounting unit includes four sides, and the shock absorbing material is disposed near each of the four sides.

20. The multi-socket guide of claim 1, wherein the mounting unit includes four sides, and the shock absorbing material is disposed near each of the four sides.

* * * * *